United States Patent
Mori

(10) Patent No.: US 6,204,123 B1
(45) Date of Patent: Mar. 20, 2001

(54) VERTICAL FLOATING GATE TRANSISTOR WITH EPITAXIAL CHANNEL

(75) Inventor: Kiyoshi Mori, San Antonio, TX (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 0 days.

(21) Appl. No.: 09/183,112

(22) Filed: Oct. 30, 1998

(51) Int. Cl.[7] .................................................. H01L 21/336

(52) U.S. Cl. ...................... 438/259; 438/268; 438/270; 257/316; 257/318

(58) Field of Search .................................. 438/259, 268, 438/270; 257/316–323

(56) References Cited

U.S. PATENT DOCUMENTS

| | | | |
|---|---|---|---|
| 4,145,703 | 3/1979 | Blanchard et al. | 357/55 |
| 4,670,768 | 6/1987 | Sunami et al. | 357/42 |
| 4,992,838 | 2/1991 | Mori | 357/23.4 |
| 5,016,067 | 5/1991 | Mori | 357/23.4 |
| 5,016,068 | 5/1991 | Mori | 357/23.5 |
| 5,071,782 | 12/1991 | Mori | 437/48 |
| 5,078,498 | 1/1992 | Kadikia et al. | 357/23.4 |
| 5,124,764 | 6/1992 | Mori | 357/23.4 |
| 5,141,886 | 8/1992 | Mori | 437/43 |
| 5,160,491 | 11/1992 | Mori | 437/40 |
| 5,162,247 | * 11/1992 | Hazani . | |
| 5,229,312 | * 7/1993 | Mukherjee et al. . | |
| 5,378,914 | 1/1995 | Ohzu et al. | 257/369 |
| 5,442,214 | 8/1995 | Yang | 257/328 |
| 5,576,567 | 11/1996 | Mori | 257/316 |
| 5,621,234 | 4/1997 | Kato | 257/339 |
| 5,770,514 | 6/1998 | Matsuda et al. | 438/589 |
| 5,872,375 | 2/1999 | Yamazaki | 257/330 |
| 5,886,382 | * 3/1999 | Witek | 257/322 |
| 5,973,356 | * 10/1999 | Noble et al. | 257/319 |
| 5,998,261 | * 12/1999 | Hofinann et al. | 437/257 |

OTHER PUBLICATIONS

Solid State Electronic Devices, Third Edition, 1990 (month unknown); 325–327 and 347–350; Ben G. Streetman; Prentice Hall, Englewood Cliffs, New Jersey 07632.

G. Rittenhouse, W. Mansfield, and A Kornblit, "Sub–0.1 $\mu$m NMOS Transistor Fabricated Using Laser Plasma Point–Source X–Ray Lithography." IEEE Electron Device Letters, vol. 16, No. 7, Jul. 1995, pp. 322–324.

S. Maeda, T. Ipposhi, and H. Nishimura, "Impact of Vertical O–Shape Transistor Cell for 1 Gbit DRAM and Beyond." IEEE Transactions on Electron Devices, vol. 42, No. 12, Dec. 1995, pp. 2117–2123.

(List continued on next page.)

*Primary Examiner*—Richard Booth
*Assistant Examiner*—Yvonne A. Gurley
(74) *Attorney, Agent, or Firm*—Christopher M. Tobin; Harold T. Fujii

(57) ABSTRACT

A vertical floating gate transistor includes an epitaxially formed channel between its lower source/drain region and upper source/drain region, with a floating gate electrode in a trench that extends vertically through those regions and a control or programming gate electrode above and separated from the floating gate electrode. A process for forming the vertical floating gate transistor implants the substrate to provide the lower source/drain region, then forms an epitaxial layer that provides the channel over the previously formed lower source/drain region. Then, the upper source/drain region is implanted above the lower source/drain region and epitaxial channel layer, followed by formation of a vertical trench and the floating and control gates. Forming the epitaxial layer over a previously implanted lower source/drain region allows independent control of the resistivity of the lower source/drain region, such that it can have low resistivity, facilitating device symmetry. Also, the epitaxial channel layer has improved doping uniformity over diffusion type channel region, lowering channel length and increasing performance and yield. Finally, the source/drain regions may incorporate two separate dopants to provide an extended region that further minimizes the channel length while providing higher punch through voltage levels and retaining low resistivity.

10 Claims, 8 Drawing Sheets

OTHER PUBLICATIONS

M. Cao, T. Kamins, and P. Voorde, "0.18–$\mu$m Fully–Depleted Silicon–on–insulator MOSFET's." IEEE Electron Device Letters, vol. 18, No. 6, Jun. 1997, pp. 251–253.

T. J. Rodgers, and J. D. Meindl, "VMOS: High–Speed TTL Compatible MOS Logic." IEEE Journal of Solid–State Circuits, vol. SC–9, No. 5, Oct. 1974, pp. 239–250.

K. Mori, "Sub–half Micron Device Fabricated with Two Microns Generation Facilities." The Proceedings of the 1998 SPIE International Conference on Microelectronics Device Technology, pp. 132–140.

J. Nishizawa, N. Takeda, and S. Suzuki, "U–Grooved SIT CMOS Technology with 3 fJ and 49 ps (7 mW, 350 fJ) Operation." IEEE Transactions on Electron Devices, vol 37, No. 8 Aug. 1990, pp. 1877–1883.

L. Risch, W. Krautschneider, and F. Hofmann, "Vertical MOS Transistor with 70 nm Channel Length." IEEE Transactions on Electron Devices, vol. 43, No. 9, Sep. 1996, pp 1495–1498.

V. Dudek, W. Appel, and L. Beer, "Lithography–Independent Nanometer Silicon MOSFET's on Insulator." IEEE Transactions on Electron Devices, vol. 43, No. 10, Oct. 1996, pp 1626–1631.

W. F. Richardson, D.M. Bordelon, and G. P. Pollack, "A Trench Transistor Cross–Point Dram Cell." The Proceedings of IEEE International Electron Device Meeting, Dec. 1985, pp. 714–717.

S. Nakajima, K. Miura, and T. Somatani, "A Trench MOSFET with Surface Source/Drain Contacts." The Proceedings of IEEE International Electron Device Meeting, Dec. 1985, pp. 200–203.

\* cited by examiner

VERTICAL FLOATING GATE TRANSISTOR WITH EPITAXIAL CHANNEL

CROSS REFERENCE TO RELATED APPLICATIONS

The subject matter of the present application is related to U.S. application Ser. No. 09/183,040, now U.S. Pat. No. 6,114,205, entitled "Epitaxial Channel Vertical MOS Transistor," filed on Oct. 30, 1998 by Kiyoshi Mori, the contents of which are hereby incorporated by reference.

BACKGROUND OF THE INVENTION

1. Field of the Invention

This application relates generally to fabricating integrated circuits, and more particularly to a process for forming an epitaxial channel vertical floating gate transistor.

2. Description of the Related Art

Conventional thin film processing techniques are now commonly used to produce integrated circuits. These integrated circuits may incorporate various devices, including transistors. One type of transistor is a floating gate transistor, which is often used in nonvolatile memories because the floating gate can hold charge, and thus retain stored information, without requiring a connection to a power supply.

As with a standard transistor, the floating gate transistor uses a control gate that is insulated from a channel in which conduction between the transistor source and drain may occur dependent upon the gate to source voltage. Specifically, appropriate biasing of the control gate can create an electrical field that attracts charge carriers into the channel to provide a conductive path between the source and drain of the floating gate transistor. However, unlike the standard transistor, the floating gate transistor includes a floating gate that is typically located between the control gate and the channel region. The floating gate transistor can be programmed or erased by causing charge carriers to enter or leave the floating gate, which can retain the charge carriers because it is electrically isolated. The presence or absence of charge carriers on the floating gate dictates the threshold voltage of the floating gate transistor; this is used to identify the information stored in the floating gate transistor.

As with the standard transistor, increasing scales of integration mandate the inclusion of increasing numbers of floating gate transistors on a single chip, which spawns the demand for closer spacing in order to allow their inclusion in a finite amount of space. An important dimension in the fabrication of semiconductor devices, including floating gate transistors, is the length of the channel. The length of the channel affects transistor operation, and impacts the number of transistors that can be provided in a given space. It is therefore desirable to minimize the channel size and to provide consistent channel dimensions and characteristics when fabricating integrated circuits.

Other concerns in the fabrication of integrated circuits are the provision of source and drain regions that do not have high resistivity, particularly for low voltage applications, where high resistivity prevents proper operation. Also, it is desirable to retain control of the resistivity of the source and drain regions during fabrication, so that produced transistors can have substantially equal source and drain resistivity, facilitating symmetrical read operations for the floating gate transistor (i.e., interchangeable source and drain regions).

A vertical floating gate transistor includes a drain (or source) region that has a greater depth within the substrate than does its source (or drain) region, as well as an intervening channel. The source, drain and channel are generally arranged in a vertical direction. This arrangement can be advantageous because it consumes less substrate surface area than horizontal arrangements. Also, the vertical transistor can provide a transistor having a channel length that is smaller than that which could be produced for the horizontal type, which is more directly limited by the minimum photolithographic resolution. Thus, it may be more desirable to implement vertical transistors for increasing scales of integration.

Certain aspects of conventional vertical transistors, however, remain problematic. For example, the barriers to controlling the resistivity of the lower doped region makes it difficult to produce a device having symmetry. Additionally, producing floating gate transistors with accurate, small channel lengths is desired. Finally, since the floating gate transistor is often used in memories where low power operation is desired, it is imperative to provide a deeper doped region with a low resistivity.

Thus, there remains a need for a vertical floating gate transistor with a minimized, consistent channel length, and which has upper and lower source/drain regions with low resistivity, and which offers symmetrical read operations.

SUMMARY OF THE INVENTION

Vertical floating gate transistors and processes for fabricating a vertical floating gate transistors in accordance with the present invention provide an epitaxial channel between a previously formed lower source/drain region and a subsequently formed upper source/drain region to provide minimal, consistent channel length, low source/drain resistivity, and more direct control of the properties of the upper and lower source/drain regions.

In one embodiment, the vertical floating gate transistor is formed by implanting the substrate with a dopant or dopants to initially form a lower source/drain region, followed by forming an epitaxial channel layer over the previously implanted lower source/drain region. The upper source/drain region is then formed above the lower source/drain region and epitaxial channel layer, and then a floating gate and control gate are formed in a vertical trench, with the floating gate being insulated from the channel and source/drain regions, and the control gate being insulated from the floating gate.

Forming the epitaxial layer over the previously implanted lower source/drain region (instead of using a deeply diffused portion of an implant for the lower source/drain region) lowers and improves control of the resistivity of the lower source/drain region because the portion of the lower source/drain region implant that is actually retained is not merely the deeply diffused portion. Lowering the resistivity of the lower source/drain region generally improves performance and allows low voltage applications. Additionally, having independent control of the lower source/drain resistivity allows its resistance to be matched with that of the upper source/drain region. Thus, during a read operation, the lower source/drain region may operate as either the source or the drain, and the upper source/drain region may operate as either the drain or the source.

An additional benefit is that the epitaxial channel layer has improved doping uniformity over conventional diffusion type vertical floating gate transistor channel regions. Furthermore, certain embodiments of the present invention also incorporate first and second dopant implants (e.g. phosphorus and arsenic) for forming the source/drain regions. This can provide an extended source/drain region (e.g., the phosphorus portion, which diffuses further than arsenic), which minimizes channel length, while retaining low resistivity and maximizing punch through voltage levels.

BRIEF DESCRIPTION OF THE DRAWINGS

These and other more detailed and specific features of the present invention are more fully disclosed in the following specification, reference being had to the accompanying drawings, in which.

DETAILED DESCRIPTION OF THE INVENTION

An advantage in fabricating vertical transistors is that channel length scaling is not directly limited by, among other things, the resolution provided by conventional photolithography. One reason for this is that, as shown in FIG. 1H, the source 108, drain 104 and channel 106 regions are arranged vertically. The separation of the source and drain regions in the vertical ("y") direction can be lower than the minimum spacing between regions in the horizontal ("x") direction, since the horizontal direction spacing is more directly impacted by photolithographic resolution.

Figure 1A:
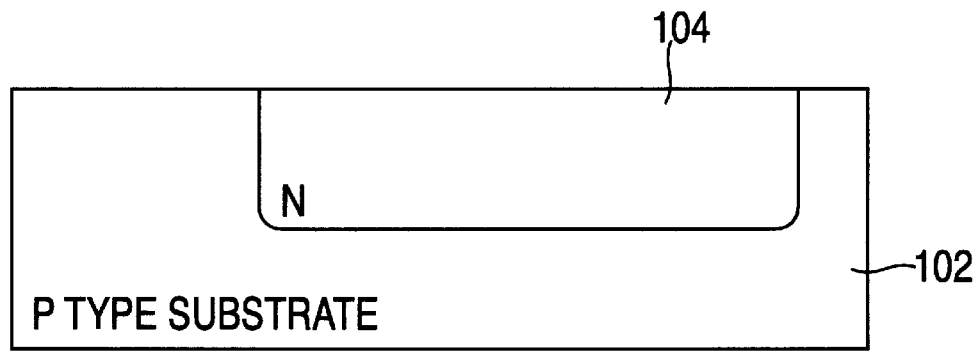
FIGS. 1A–1H are cross sectional views illustrating a sequence for fabricating a conventional vertical floating gate transistor.
Figure 1B:
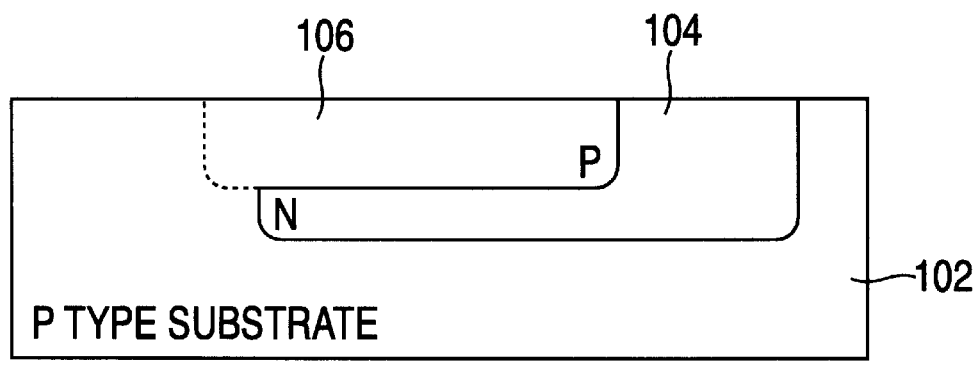
Figure 1C:
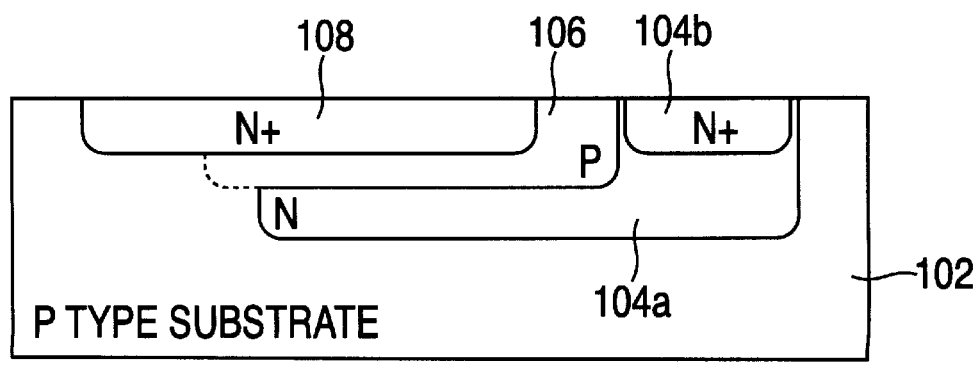
Figure 1D:
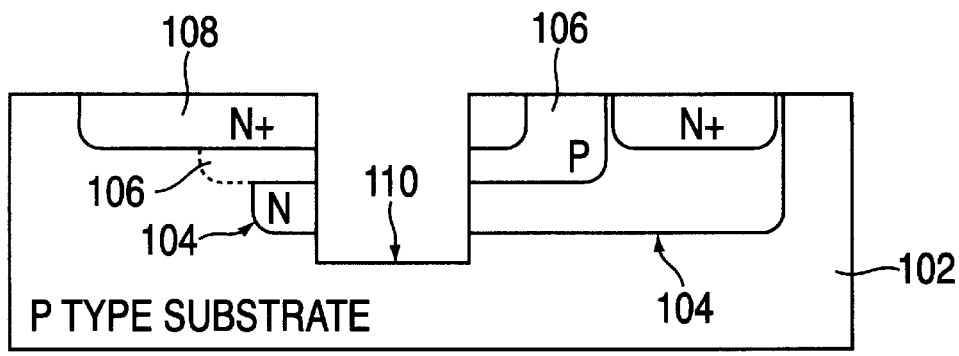
Figure 1E:
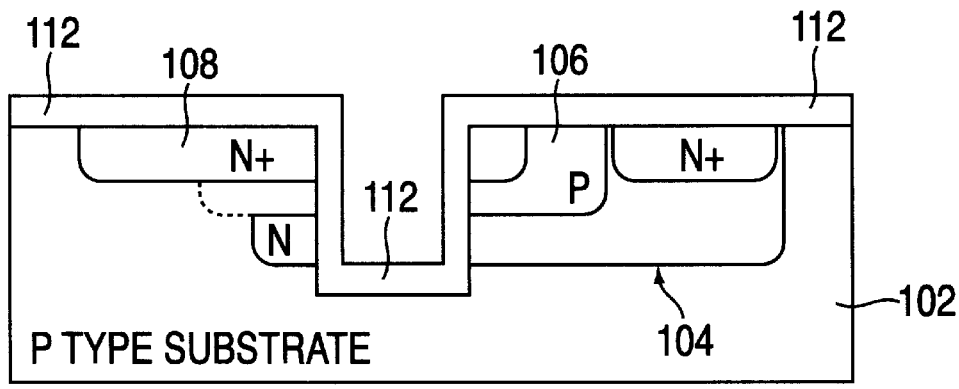
Figure 1F:
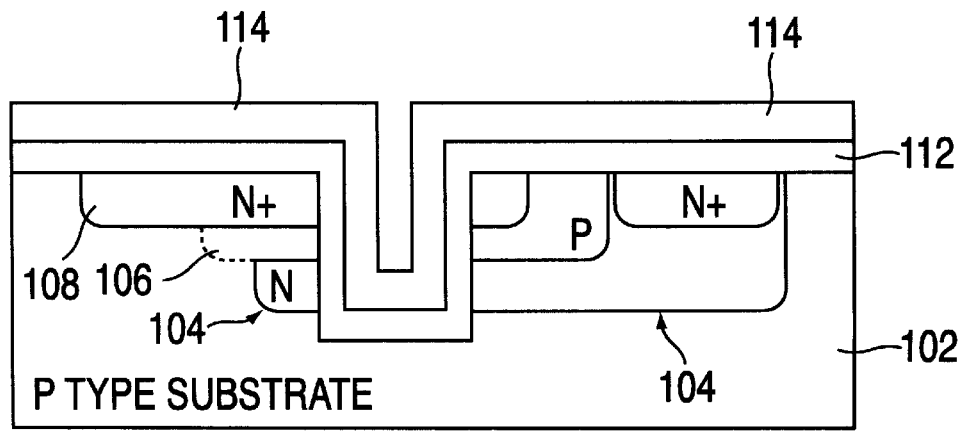
Figure 1G:
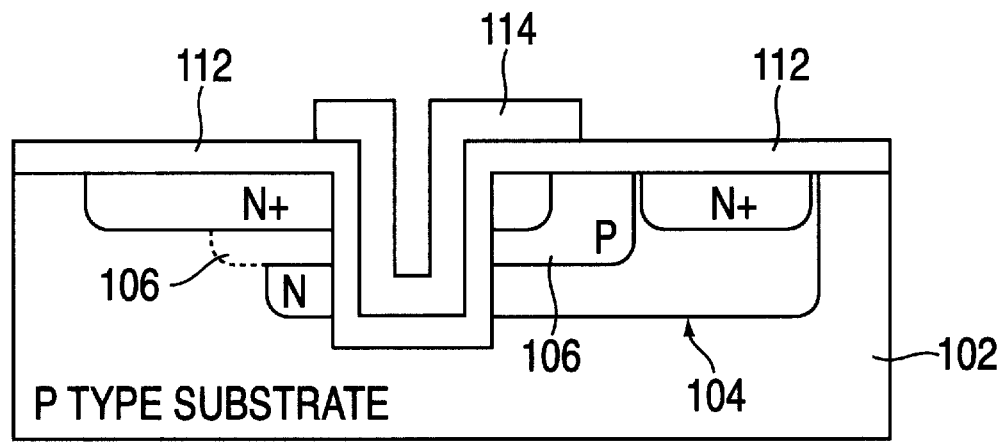
Figure 1H:
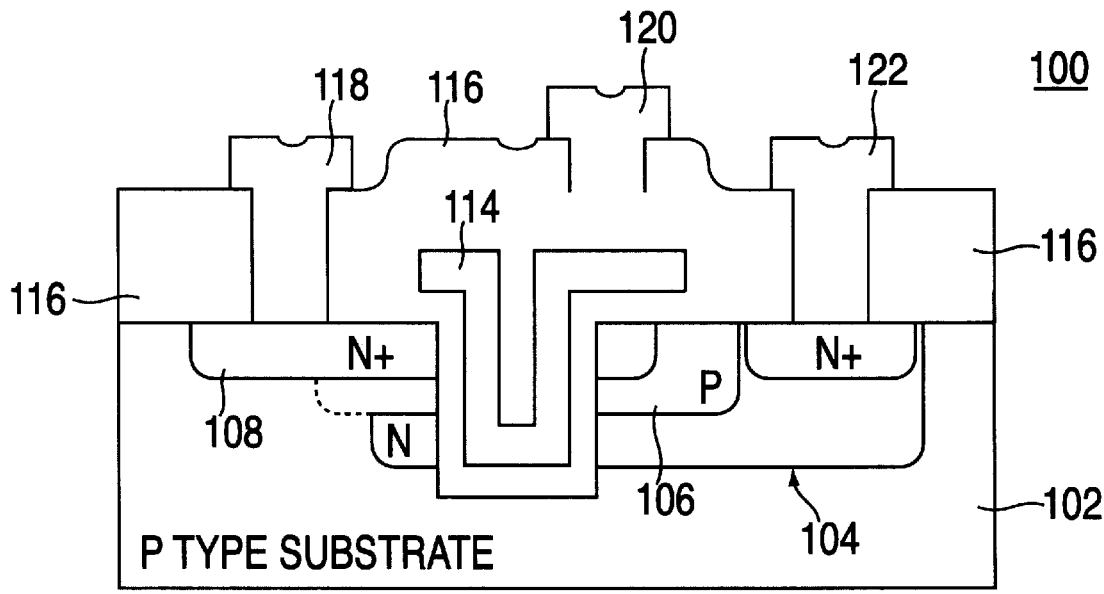

The cross sectional views of FIGS. 1A–1H illustrate a sequence for fabricating a conventional vertical MOS transistor 100. The vertical transistor is fabricated on a substrate 102, such as a p-type substrate which may, for example, be monocrystalline having a resistivity of approximately 10 ohms per centimeter. As shown in FIG. 1A, the drain 104 region is first formed in the substrate 102. The drain region 104 may comprise a diffused N-type region formed in the substrate 102 by initially using photoresist processing to define a window on the surface of the substrate 102, then implanting with phosphorus in the defined area, and finally by annealing at a high temperature to drive the phosphorus impurities to a desired depth. For these steps, an exemplary process implants phosphorus at a dosage of 2e13 and energy of 150 KeV, and diffuses the impurities at a temperature of 1050C for 600 minutes.

After the formation of the drain region 104, the channel region 106 is formed over the drain region 104. Specifically, as shown in FIG. 1B, the channel region 106 resides above the drain region 104 in the vertical direction, and substantially overlaps the drain region 104 in the horizontal region, with a small portion residing in the unmodified portion of the substrate 102. The channel region 106 is formed by photoresist processing to provide a window (not shown) on the surface of the substrate 102, followed by a boron implant and a high temperature anneal to drive the boron impurities into the transistor channel region 106. In the horizontal direction overlap between the channel region 106 and drain region 104, the boron impurities overwhelm the previously introduced phosphorus impurities to cause the region to be a P type region. An exemplary channel region forming process implants boron at a dosage from 1e13 to 3e13 at an energy of 150 KeV, and diffuses the channel forming impurities at 900C for 60 minutes.

The source region 108 is then formed over the previously formed channel 106 and drain 104 regions. Photoresist processing provides a window for an implant step followed by a high temperature anneal to drive the appropriate impurities into the substrate. Here, an arsenic implant is diffused into the substrate by, for example, a 900C, 60 minute high temperature anneal. As shown in FIG. 1C, the source region 108 generally resides above the channel region 106, and substantially overlaps the channel region 106 in the horizontal direction, with a portion residing generally in the unmodified portion of the substrate 102. Again, although the overlapping portion is originally P type for the channel region 106, the arsenic impurities overwhelm the boron impurities in that region to cause the region to be of the N type (for the source region 108). During the steps for forming the source region 108, arsenic may also be implanted to supplement the originally formed drain region 104, which is shown as drain region 104b in FIG. 1C. Exemplary source region 108 forming steps implement arsenic at a dosage of 5e15 and energy of 50 KeV, and diffuse the arsenic impurities at 900C for 60 minutes.

Referring now to the cross sectional diagram of FIG. 1D, a trench 110 that extends vertically through the previously formed drain 104, channel 106 and source 108 regions and into the substrate 102 is then formed. Particularly, photoresist processing to open a window for the trench 110, followed by a plasma or RIE dry etch may be used to form the trench. The trench 110 provides a region where the gate electrode for the vertical resides.

FIG. 1E illustrates the substrate after the formation of the gate oxide layer 112. The gate oxide layer 112 insulates the gate electrode from the channel region 106, as well as the source 108 and drain 104 regions. It can be formed by a conventional oxidation processes. After the formation of the gate oxide layer 112, a polysilicon layer may then be deposited over the gate oxide layer 112 (FIG. 1F) and then etched to provide the polysilicon gate 114 of the MOS device as shown in FIG. 1G.

After the formation of the polysilicon gate 114, a relatively thick oxide layer 116 is formed. Then contact holes are formed in the thick oxide layer 116, followed by conventional metallization and etching to provide the drain 118, gate 120 and drain 122 contacts for the vertical MOS transistor as shown in FIG. 1H.

With the conventional vertical MOS transistor 100, additional boron implants may also be used to separate the source 108 and drain 104 regions, and phosphorus implants may be used to lower the resistance of the portion connecting the lower (104a) and upper (104b) drain region 104. However, the conventional vertical MOS transistor and corresponding process illustrated in FIGS. 1A–1H remains inadequate. For example, with channel lengths significantly below 0.25 microns, they exhibit low source to drain punch through voltages (e.g., <5V). One attempt at improvement has been to keep the net doping concentration in the channel region 106 higher than that of the source 108 and drain 104 regions. However, relatively low doping in the lower drain region 104 causes high resistivity and a corresponding significant negative effect on the characteristics of the device.

Also, the conventional vertical MOS transistor drain region 104 typically has a relatively high resistivity, particularly compared to the source region 108. One reason for this is that the usable portion of the originally formed drain region 104 must be diffused a significant depth into the substrate during fabrication. This generally hurts performance, particularly for low voltage applications, and prevents symmetry.

Alternative solutions use an N type epitaxial layer that is subsequently implanted with P type dopants to form a channel region that resides between lower and upper source/drain regions. However, this alternative is also inadequate because the channel length can be difficult to minimize and predict since it is a P-type region that is created by implanting through the previously formed layer that will provide the N-type upper source region. The need for an adequately thick upper source region prevents the formation of a high quality channel of minimal length. Similarly, the boundary between the channel region and the lower, drain region can be difficult to control since the channel region is implanted and diffused into the previously formed N type epitaxial region.

Accordingly, even assuming an extension of the conventional vertical MOS transistor to floating gate transistors, there are remaining design inadequacies.

Figure 2A:
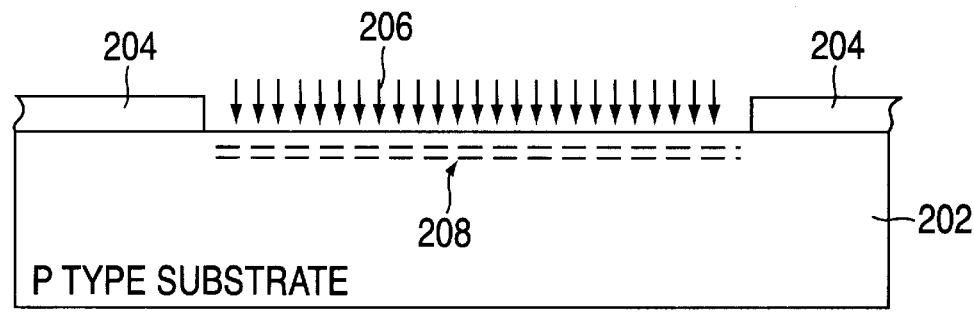
FIGS. 2A–2J are cross sectional views illustrating a sequence for fabricating an embodiment of a vertical floating gate transistor in accordance with the present invention.
Figure 2B:
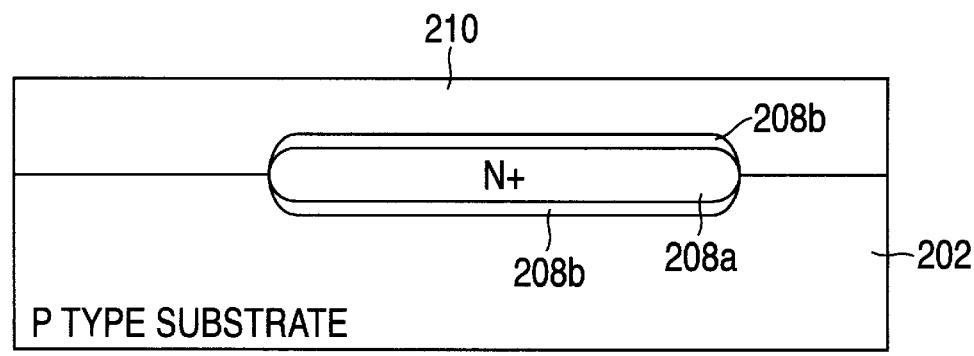
Figure 2C:
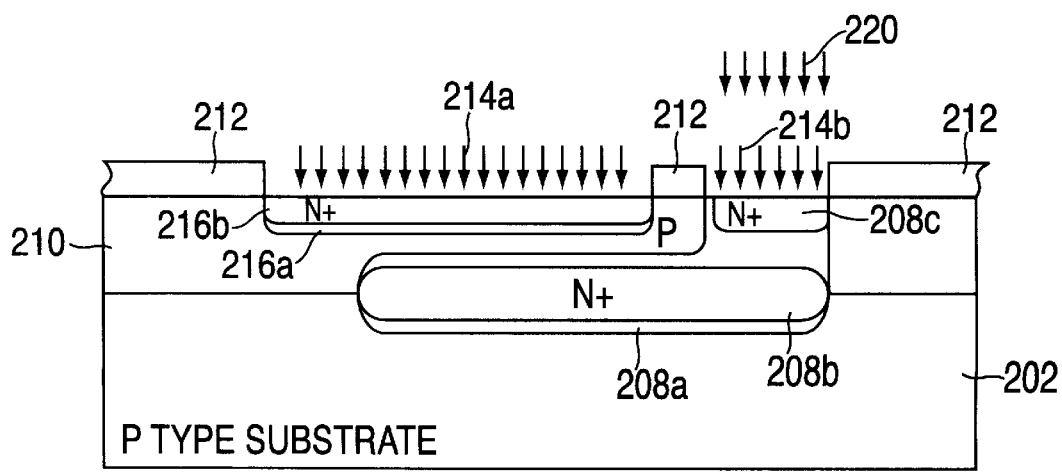
Figure 2D:
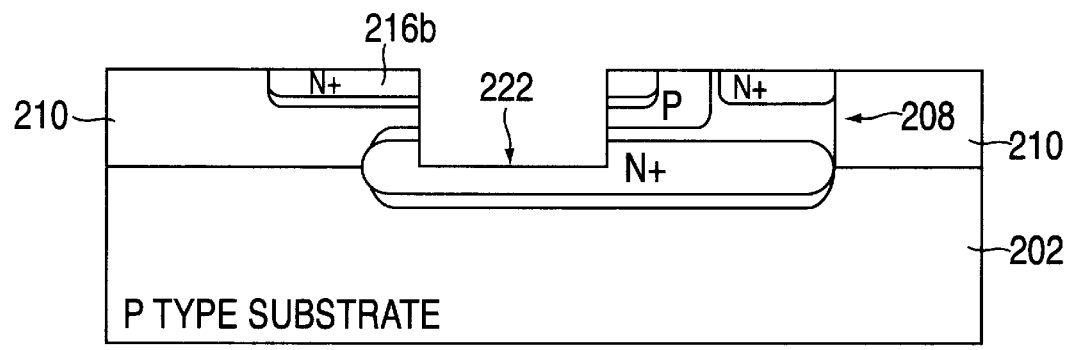
Figure 2E:
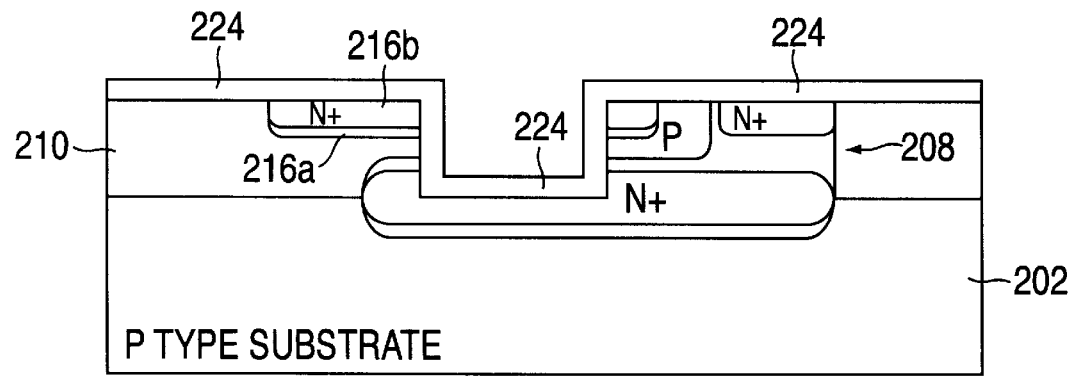
Figure 2F:
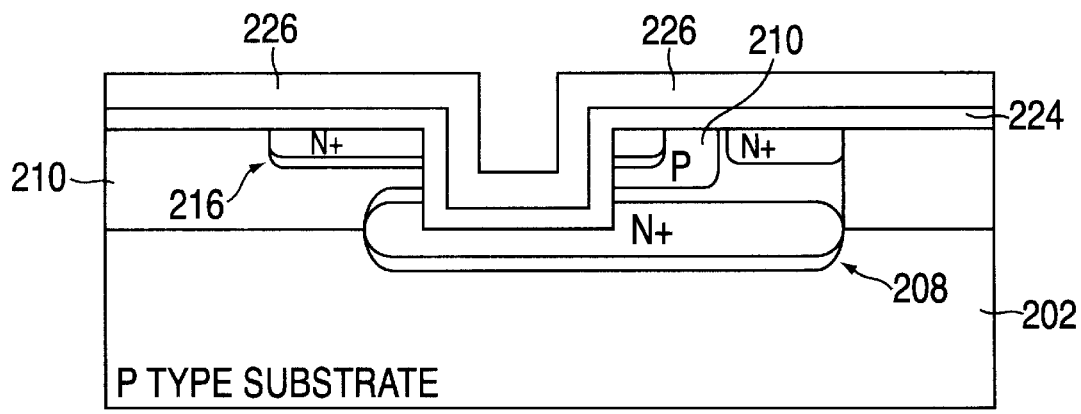
Figure 2G:
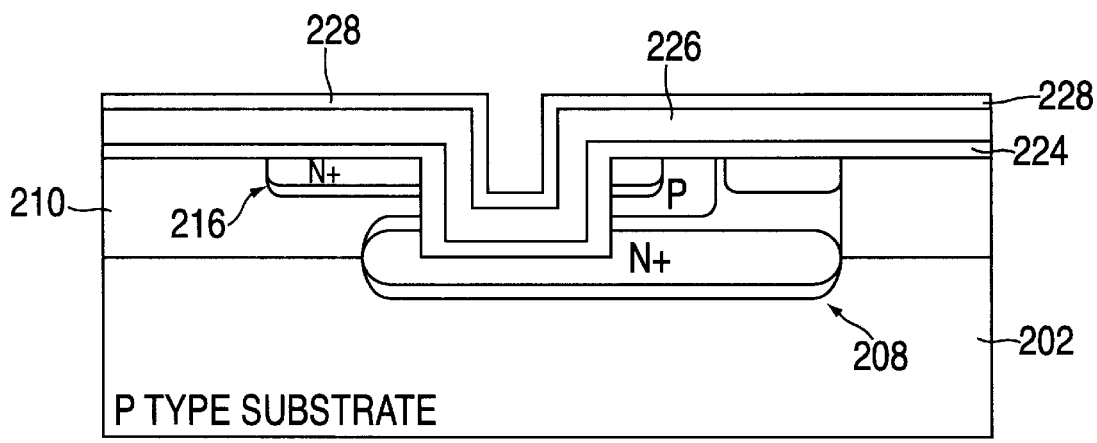
Figure 2H:
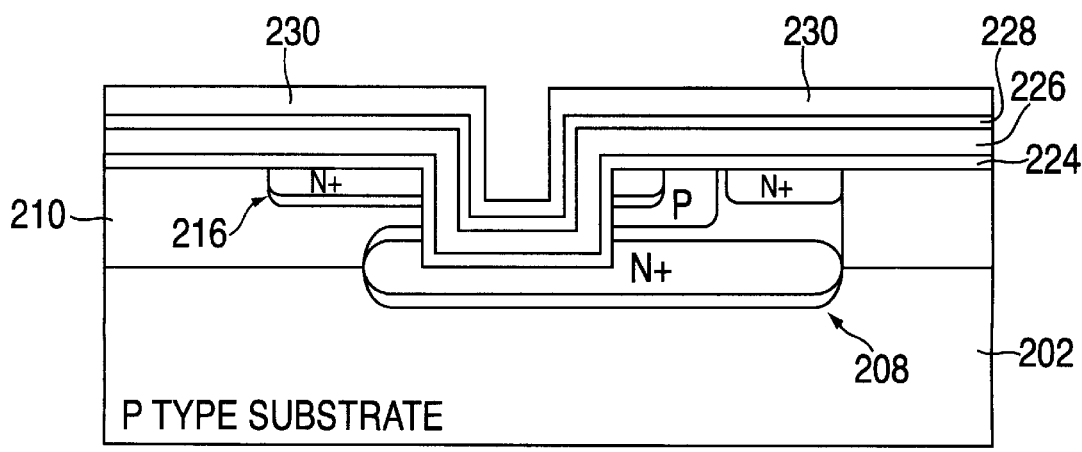
Figure 2I:
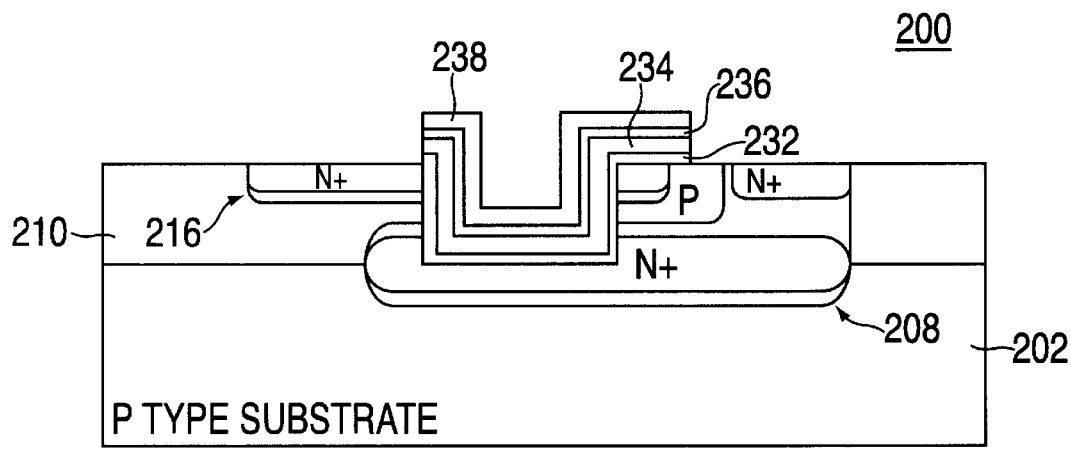
Figure 2J:
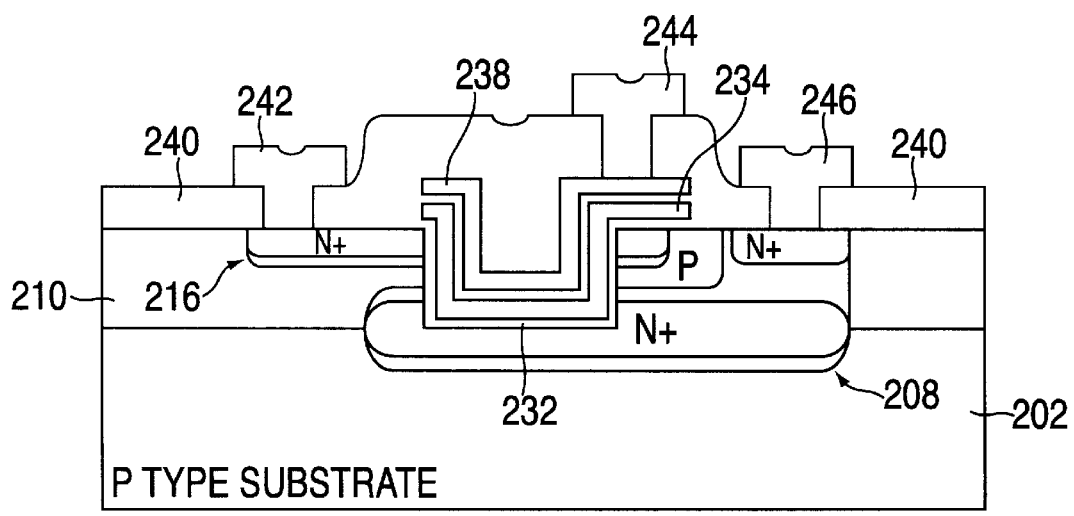
Figure 3:
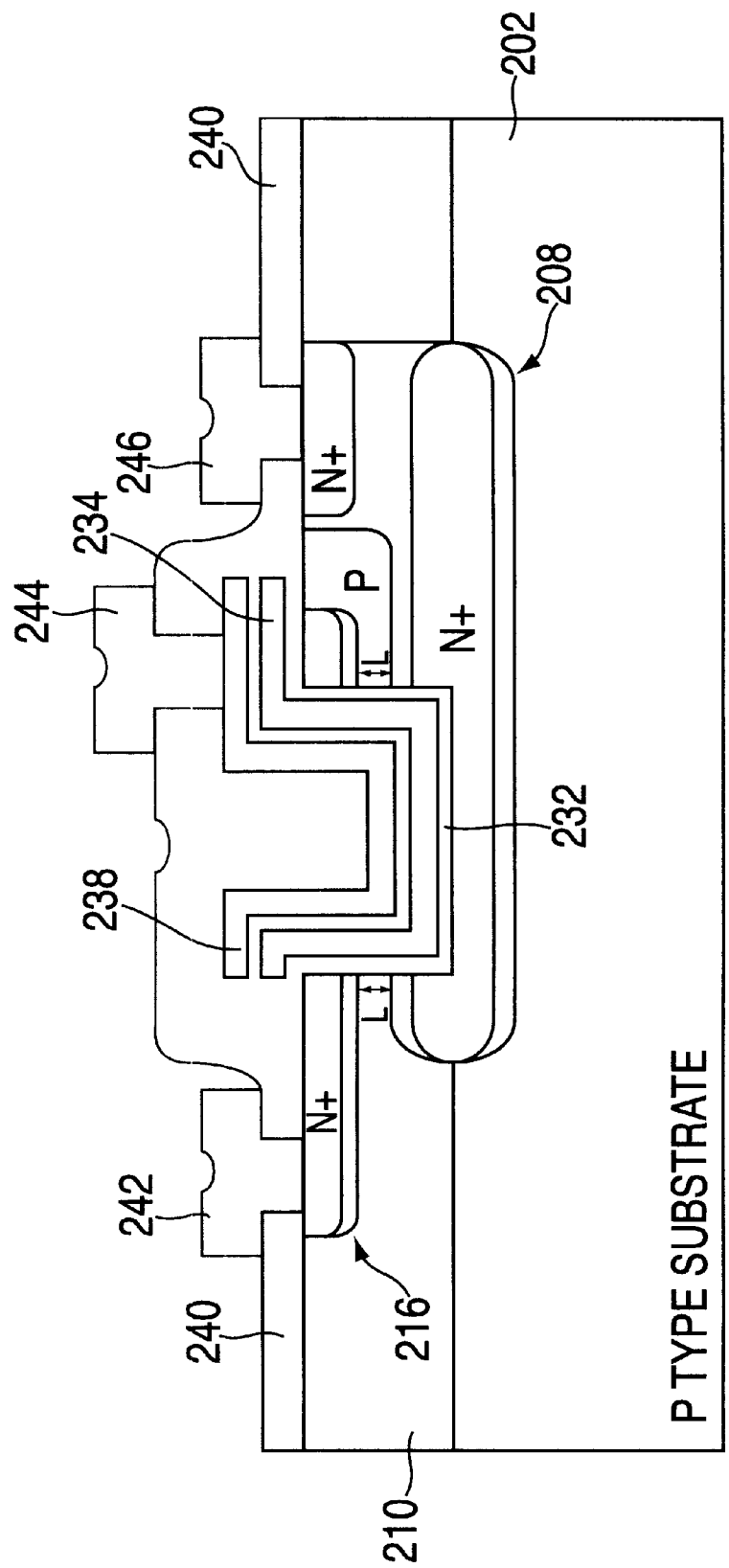
FIG. 3 is a cross sectional view of an embodiment of a vertical floating gate transistor in accordance with the present invention, with illustration of the channel length.

The cross sectional diagram of FIG. 3 illustrates an embodiment of a vertical floating gate transistor 200 constructed in accordance with the present invention, and the cross sectional diagrams of FIGS. 2A–2J illustrate an embodiment of a process for fabricating the vertical floating gate transistor 200 in accordance with the present invention.

The vertical floating gate transistor 200 may be fabricated in a single MOS process, or as part of a CMOS process. For ease of description, the process for fabricating the vertical floating gate transistor 200 is described in connection with a single MOS process. Particularly, the fabrication of an NMOS device is described. Although the NMOS device is preferred, the present invention may well be extended to PMOS designs, and CMOS designs including NMOS and PMOS devices. In a CMOS embodiment, conventional front end processing provides N type well regions (not shown) in a P type substrate in those locations where PMOS devices are to be formed.

The vertical floating gate transistor 200 includes first and second source/drain regions, one residing below the channel region (the lower source/drain region 208) and one residing above the channel region (the upper source/drain region 216). One feature of this embodiment of the present invention is the operational symmetry and corresponding interchangeable vertical floating gate transistor source and drain regions (i.e., during, for example, a read operation, each source/drain region 208, 216 may operate as either a source or a drain region.). For ease of description, the regions are respectively referenced as the upper source/drain region 216 and lower source/drain region 208.

Referring first to the cross sectional diagram of FIG. 2A, the vertical floating gate transistor 200 is formed in a semiconductor substrate 202. For this embodiment, the semiconductor substrate 202 is a P type substrate, such as mono-crystalline silicon with a resistivity of approximately 10 ohms per centimeter.

The initial step for forming the lower source/drain region 208 is implanting N type dopants into the substrate 202. Conventional lithography (e.g., photolithography) provides a mask 204 having a pattern that defines a window (or windows, for numerous transistors) at the surface of the substrate 202. The window corresponds to the desired location for the source/drain region 208 implant. The mask 204 allows implantation within the window area, and blocks implantation outside the window. The arrows 206 in FIG. 2A depict the implant for the lower source/drain region 208, which uses at least one N type dopant. Preferably, two separate implant steps will be used for the implant, one phosphorus and the other arsenic. An example of the lower source/drain region 208 implants are arsenic at a dosage of about 3e15 atoms/cm$^2$ and an energy of about 40 KeV, and phosphorus at a dosage of about 3e14 atoms/cm$^2$ and an energy of about 10 KeV. The effect of using these two dopants is described further below.

Referring now to the cross sectional diagram of FIG. 2B, after the implant(s) for the lower source/drain region 208, the mask 204 is removed and an epitaxial layer 210 is grown over the substrate 202. The epitaxial layer 210 includes the channel region that will reside between the lower source/drain region 208 and the subsequently formed upper source/drain region 216. An exemplary epitaxial layer 210 is grown approximately 0.60–1.00 microns thick, with boron at approximately 1e17–2e18, at a temperature of approximately 1000C for about 30 minutes.

The high temperature conditions used for forming the epitaxial layer 210 cause the dopants implanted for the lower source/drain region 208 to diffuse laterally and vertically, further into the substrate 202 and the epitaxial layer 210. Where two dopants are used, the phosphorus diffuses further into the substrate 202 and epitaxial layer 210 than does the arsenic. The arsenic resides within the inner portion 208a of the lower source/drain region 208, and the phosphorus extends further, into the outer portion 208b of the lower source/drain region 208. The arsenic has a relatively low diffusion rate and provides a relatively high dopant concentration to provide a source/drain region having generally low resistivity. The phosphorus has a high diffusion rate and is provided at a relatively low dopant concentration to provide a sub-region of relatively high resistivity. The combination of the arsenic and phosphorus thus provides a resultant structure having low operational resistivity, yet allows minimal channel lengths while retaining adequately high punch through voltages.

Referring to the cross sectional diagram of FIG. 2C, after the formation of the epitaxial layer 210, an initial step in forming the upper source/drain region 216 includes appropriately implanting the epitaxial layer 210 with at least one N type dopant, as depicted by arrows 214. Conventional photolithography is used to provide a mask 212 including a pattern that defines a window corresponding to where the upper source/drain region 216 is to be formed. As with the lower source/drain region 208, two separate phosphorus and arsenic implant steps are preferably used for the upper source/drain region 216. By way of example, arsenic at a dosage of about 5e15 and an energy of about 25 KeV, and phosphorus at a dosage of about 3e13 and an energy of about 40–115 KeV may be used for the implant.

The implant for the upper source/drain region 216 can also be used to form the upper portion 208c of the lower source/drain region 208. Where such implanting is desired, the mask 212 includes an appropriate window for the upper portion 208c as shown in FIG. 2C (represented by arrows 214b over the relevant portion 208c).

After implanting for the upper source/drain region 216 and the upper portion 208c of the lower source/drain region 208, another implant step (depicted by arrows 220) can be used to extend the lower source/drain region 208 to the surface. For this implant, conventional photolithography would be used to provide a mask that would allow the implant only in locations corresponding to the upper portion 208c, as illustrated by the arrows 218 in FIG. 2C. This implant uses an N type dopant, preferably phosphorus. A multistage implant of phosphorus may be used where desired. An example of a three stage implant is phosphorus at a dosage of about 1e13 and an energy of about 70 KeV, followed by phosphorus at a dosage of about 1e13 and an energy of about 100 KeV, and then phosphorus at a dosage of about 1e13 and an energy of about 150 KeV. The artisan will recognize the various alternatives.

A high temperature anneal, for example with an $N_2$ environment at 900C for about 60 minutes, may be used to diffuse the implanted regions further into the substrate and epitaxial layer. Again, the phosphorus diffuses further into the epitaxial layer 210 than the arsenic. Thus, the arsenic resides within an inner portion 216a and the phosphorus extends to an outer portion 216b of the upper source/drain region 216. Thus, as with the lower source/drain region 208, the upper source drain region has an overall low resistivity, yet provides a lightly doped region having a relatively high resistivity to prevent undesirable effects, such as low punch through voltage. Additionally, provision of the lightly doped drain structure for both the upper and lower source/drain regions further promotes device symmetry.

Referring now to the cross sectional diagram of FIG. 2D, conventional lithographic techniques can then be used to provide a window for a trench 222 which is formed using plasma or reactive ion etching. The trench 222 extends through the upper source/drain region 216, the lower source/drain region 208, and the portion of the epitaxial layer 210 which provides the channel between the upper 216 and lower 208 source/drain regions. The trench 222 is shown to completely extend through the lower source/drain region 208. Alternatively, it can extend partially through the lower source/drain region 208.

Once the trench 222 is formed, then, as shown in the cross sectional diagram of FIG. 2E, an insulating layer 224 is formed over the substrate 202. The insulating layer 224 will insulate the gate electrode from the source, drain, and channel regions in the vertical Floating gate transistor 200. The insulating layer 224 can, for example, be formed using conventional thermal oxidation. Preferably, an initial pad oxide layer which is removed by wet etching followed by a thermal oxidation to form a well controlled insulating layer 224. For the floating gate transistor 200, the insulating layer 224 forms what is typically referred to as gate oxide in a standard MOS transistor. Typically, the insulating layer 224 is between approximately 70 and approximately 200 Angstroms, and designs will vary depending upon process capabilities and design constraints. The insulating layer 224 also provides a region for electrons to tunnel between the floating gate and source/drain region. This region (not shown) may be referred to as the tunnel oxide region, and is typically thinner than the remainder of the insulating layer 224.

Referring to the cross sectional diagram of FIG. 2F, a layer of polysilicon 226 is then deposited over the insulating layer 224, such as by a conventional LPCVD process or the like. This layer of polysilicon 226 will form a polysilicon gate (234, FIG. 2I) that is referred to as a floating gate. Typically, the polysilicon layer 226 will be between approximately 700 and approximately 1500 Angstroms thick.

Subsequently, an additional insulating layer 228 is formed over the polysilicon layer 226 as illustrated in the cross sectional diagram of FIG. 2G. The insulating layer 228 will ultimately form what is referred to as an interpoly oxide layer (236) which resides between the floating gate (234) and the control gate (238) in the floating gate transistor 200.

A conventional thermal oxidation process may be used to form the insulating layer 228, which will typically be between approximately 100 and approximately 200 Angstroms thick.

Referring now to the cross sectional diagram of FIG. 2H, another polysilicon layer 230 is then formed over the insulating layer 228. This polysilicon layer 230 ultimately forms what is referred to as the control (or programming) gate of the floating gate transistor 200. Both polysilicon layers 226, 230 are typically formed using an LPCVD process, and will be between approximately 700 and 1500 Angstroms thick.

After the formation of the polysilicon layer 230, the various layers 224, 226, 228, 230 may be etched to provide insulating layer 232, polysilicon gate 234, inter-poly insulating layer 236, and second polysilicon gate 238 as illustrated in FIG. 2I. As described above, the insulating layer 232 provides the gate and tunnel oxide regions, the first polysilicon gate 234 provides the floating gate, and the second polysilicon gate 238 provides the control gate for the floating gate transistor 200. These gates 234, 238 may be formed using conventional photoresist processing to define the pattern, and etching. FIG. 2I illustrates an embodiment wherein the first and second polysilicon gates 234, 238 are self aligned. Alternatively, the first polysilicon gate 234 can be etched before the formation of the second polysilicon gate 238, and the two gates do not need to be self aligned. These and other alternatives are contemplated by the present invention.

Finally, referring to the cross sectional diagram of FIG. 2J, conventional finishing steps may then be used to complete the vertical floating gate transistor 200. Specifically, a thick oxide layer 240 insulates the polysilicon gates 234, 238 from the next conductive film, and separates the active transistor regions from one another. The thick oxide layer 240 may be formed by APCVD processing, or any conventional process for forming a thick oxide region. Contacts 242, 244, 246 are then formed using photoresist processing and etching to provide the appropriate holes, followed by metal deposition, such as aluminum sputtering, and photoresist processing and etching of the metal layer to provide the metal pattern for the contacts 242, 244, 246. The thick oxide layer 240 may be referred to as a field oxide layer, and typically will be between approximately 3500 and 6500 Angstroms thick.

With certain conventional vertical floating gate transistors, the portion of the drain region that interfaces with the channel is diffused a significant depth into the substrate, making its resistance harder to control, and generally higher. By contrast, the same portion of the source/drain region in vertical floating gate transistor 200 is more directly controlled since it is implanted and then covered with the epitaxial layer 210, not deeply diffused. Thus, with the vertical floating gate transistor of the present invention, such as the embodiment 200 of FIG. 2J, the properties of the lower source/drain region 208 can be more easily controlled to match those of the upper source/drain region 216. Also, the availability of a lower resistance for the lower source/drain region 208 makes the vertical floating gate transistor 200 more amenable for implementation in low voltage applications.

Also, the addition of a phosphorus implant (along with arsenic) for the source/drain regions 208, 216 forms a lightly doped drain structure. This helps to provide improved drain current, and prevent low punch through voltage. Additionally, the epitaxial channel region has improved doping uniformity compared to the diffusion channel regions of conventional vertical transistors, which allows smaller lengths and more predictable fabrication results and output characteristics.

As described above, using both arsenic and phosphorus implants for the source/drain regions 208, 216 provides the lightly doped drain regions at both sides of the channel. Alternatively, one dopant (e.g., phosphorus) can be omitted, but this would remove the lightly doped drain feature, and could adversely affect device symmetry, particularly where just one of the two source/drain regions 208, 216 includes the lightly doped drain. Thus, it is preferred to include arsenic and phosphorus implants for both the upper 216 and lower 208 source/drain regions.

The floating gate transistor 200 may be operated in conventional fashion. For example, during a programming operation, very high voltage can be applied to the programming gate 238 relative to the lower source/drain region 208 to cause charge carriers to tunnel into the floating gate 234 from the lower source/drain region 208, and the opposite polarity can be used to cause charge carriers to tunnel from the floating gate to the lower source/drain region 208. The upper source/drain region 216 could be used as the source of charge carriers as well. During a read operation, the floating gate transistor operation is similar to that of a standard transistor, with a threshold voltage generally dictated by the status of the floating gate 234. With this vertical floating gate transistor 200, in a read operation, the upper source/drain region 216 may function as a source or drain, and the lower source/drain region 208 may function as a drain or source, with symmetry.

The cross sectional diagram of FIG. 3 illustrates the channel length "L" for an embodiment of the vertical floating gate transistor 200. Embodiments of vertical floating gate transistors fabricated according to the present invention can have channel lengths that are substantially smaller than previous transistors, and which offer desirable operation including high punch through voltage. One way of tailoring the transistor length L is controlling the epitaxial layer 210 thickness and the conditions for implanting phosphorus for the upper source/drain region 216. Thus, for example, varying the energy of the phosphorus implant varies the length of the channel L in the resulting transistor 200. Specifically, increasing the energy for the phosphorus implant shortens the channel length L; however, where the energy becomes too high an increasing likelihood of undesirably low punch through voltage will result.

The fabrication conditions described in this specification are provided by way of example, and once instructed according to the present invention the ordinarily skilled will recognize the myriad of fabrication options. Various additional examples of process conditions which could be used for fabricating a vertical floating gate transistor according to the present invention are described in previously referenced copending application Ser. No. 09/183,040, now U.S. Pat. No. 6,114,205, entitled "Epitaxial Channel Vertical MOS Transistor" filed on Oct. 30, 1998 by Kiyoshi Mori.

Thus, a vertical floating gate transistor and a semiconductor fabrication process for producing the same are provided in accordance with the present invention. Although the present invention has been described in considerable detail with reference to certain preferred embodiments thereof, other embodiments are possible. For example, although a single vertical floating gate transistor is described, the present invention is equally applicable to designs where multiple floating gate transistors share doped regions. Additionally, the floating gate transistor may combine with one or more standard transistors, or other floating gate transistors, to form memory cell units in a memory array. Finally, by way of example, the present invention can be used to fabricate various high density, high speed devices including EPROM, EEPROM, and flash memory devices. Therefore, the sprit and scope of the appended claims should not be limited to the description of the preferred embodiments contained herein.

What is claimed is:

1. A method for fabricating a vertical floating gate transistor on a substrate having a first conductivity type, the method comprising:

doping in a first area of the substrate to form a first doped region having a second conductivity type, said doping in the first area including implanting the substrate with a first dopant and a second dopant that differs from the first dopant, the first and second dopants forming the first doped region, wherein the first dopant has a higher diffusion rate than the second dopant;

after the step of doping in a first area, forming an epitaxial layer of the first conductivity type over the first doped region, a portion of the epitaxial layer providing a channel for the vertical floating gate transistor, wherein the step of forming the epitaxial layer causes the first and second dopants to diffuse, the first dopant extending further into the portion of the epitaxial layer that provides the channel than the second dopant;

doping in a second area to form a second doped region, the second doped region having the second conductivity type and residing above the portion of the epitaxial layer that provides the channel;

forming a trench that extends through at least a portion of the first doped region, the epitaxial layer, and the second doped region;

forming a first gate electrode in the trench, the first gate electrode being separated from the first and second doped regions by a first insulating layer; and forming a second gate electrode that is separated from the first gate electrode by a second insulating layer.

2. The method of claim 1, wherein the first dopant is phosphorus and the second dopant is arsenic.

3. The method of claim 2, wherein the step of doping the second area comprises implanting with the first dopant and the second dopant, and the first and second dopants that form the second doped region diffuse after they are implanted, the first dopant extending further into the channel than the second dopant.

4. The method of claim 3, wherein the first doped region is a drain region in the vertical floating gate transistor, and the second doped region is a source region in the vertical floating gate transistor.

5. The method of claim 3, wherein the first doped region is a source region in the floating gate transistor, and the second doped region is a drain region in the vertical floating gate transistor.

6. The method of claim 1, wherein the first conductivity type is P-type and the second conductivity type is N-type.

7. A method for fabricating a vertical floating gate transistor on a substrate having a first conductivity type, the method comprising:

doping in a first area of the substrate to form a lower source/drain region having a second conductivity type, said doping in the first area including implanting the substrate with a first dopant and a second dopant that differs from the first dopant, wherein the first dopant has a higher diffusion rate than the second dopant;

after the step of doping in a first area, forming an epitaxial layer of the first conductivity type over the lower source/drain region, a portion of the epitaxial layer providing a channel for the vertical floating gate transistor, wherein the step of forming the epitaxial layer causes the first and second dopants to diffuse, the first dopant extending further into the portion of the epitaxial layer that provides the channel than the second dopant;

doping in a second area to form an upper source/drain region, the upper source/drain region having the second conductivity type and residing above the portion of the epitaxial layer that provides the channel;

forming a trench that extends through at least a portion of the upper source/drain region, the epitaxial layer, and the lower source/drain region; and forming a first gate electrode in the trench, the first gate electrode being separated from the upper source/drain region, the channel and the lower source/drain region by a first insulating layer; and forming a second gate electrode that is separated from the first gate electrode by a second insulating layer.

8. The method of claim 7, wherein the step of doping in the second area comprises implanting with the first dopant and the second dopant, and the first and second dopants that form the second doped region diffuse after they are implanted, the first dopant extending further into the channel than the second dopant.

9. The method of claim 8, wherein the first conductivity type is P-type and the second conductivity type is N-type.

10. The method of claim 8, wherein the first dopant is phosphorus and the second dopant is arsenic.

* * * * *